(12) United States Patent
Tang et al.

(10) Patent No.: US 6,649,321 B2
(45) Date of Patent: Nov. 18, 2003

(54) STYRENE-ANHYDRIDE COPOLYMER CONTAINING AMIDO GROUP, THE PROCESS FOR PRODUCING THE SAME AND USE THEREOF

(75) Inventors: Ting-Kuo Tang, Industrial Park Taichung (CN); Shuo-Pin Lin, Industrial Park Taichung (CN); Cheng-Chung Hsiao, Industrial Park Taichung (CN); Yi-Chou Lin, Industrial Park Taichung (CN)

(73) Assignee: Great Eastern Resin Industrial Co., Ltd., Taichung (TW)

( * ) Notice: Subject to any disclaimer, the term of this patent is extended or adjusted under 35 U.S.C. 154(b) by 309 days.

(21) Appl. No.: 09/885,125

(22) Filed: Jun. 21, 2001

(65) Prior Publication Data

US 2003/0022108 A1 Jan. 30, 2003

(51) Int. Cl.[7] .......................... G03C 1/73; C08F 267/04
(52) U.S. Cl. .................... 430/270.1; 430/905; 430/906; 430/910; 525/285
(58) Field of Search ....................... 525/285; 430/270.1, 430/905, 906, 910

(56) References Cited

U.S. PATENT DOCUMENTS 3,873,319 A * 3/1975 Berg ........................ 430/273.1
4,987,054 A * 1/1991 Sondergeld et al. ..... 430/275.1

FOREIGN PATENT DOCUMENTS

| JP | 54-1018 | 1/1979 |
| JP | 54-82073 | 6/1979 |
| JP | 61-272 | 1/1986 |
| JP | 2-160242 | 6/1990 |
| JP | 2-166452 | 6/1990 |
| JP | 7-209865 | * 8/1995 |

OTHER PUBLICATIONS

English Abstract (Chem. Abstract 124 : 18518) for JP 7-209865, Aug. 11, 1995.*

* cited by examiner

Primary Examiner—Janet Baxter
Assistant Examiner—Sin J. Lee
(74) Attorney, Agent, or Firm—Bacon & Thomas

(57) ABSTRACT

The present invention relates to a novel styrene-anhydride copolymer containing amido group, which comprises the following repeating units (I) and (II):

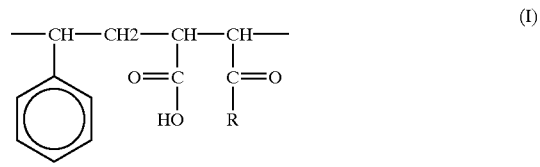

(I)

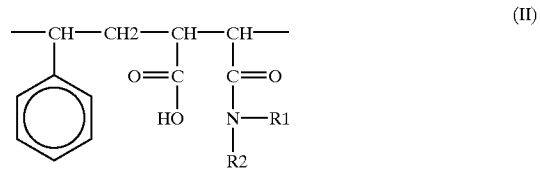

(II)

wherein
R represents a residue of (meth)acrylate monomer containing hydroxyl group;
$R^1$ and $R^2$ are the same or different and each represents a $C_{1-6}$ alkyl group, or $R^1$ and $R^2$ are taken together with the nitrogen atom to which they attach to form a 5- to 6-member heterocyclic group containing nitrogen.

The present invention also relates to process for producing the above copolymer and to the use of the copolymer as a photo resist in an alkaline soluble development of an irradiative reaction and as a solder resistant photo resist in printed circuit boards.

16 Claims, 2 Drawing Sheets

STYRENE-ANHYDRIDE COPOLYMER CONTAINING AMIDO GROUP, THE PROCESS FOR PRODUCING THE SAME AND USE THEREOF

FIELD OF THE INVENTION

The present invention relates to a novel styrene-anhydride copolymer containing amido group. The present invention further relates to a process for producing the copolymer and to the use of the copolymer as a photo resist in an alkaline soluble development of an irradiative reaction and as a photo resist in printed circuit boards.

BACKGROUND OF THE INVENTION

In the printed circuit board field, it is well known to use an excellent photosensitive resin composition as a photo resist for mask solder and chemical electroplating. The purpose of using the mask solder is to control the area of solder, to avoid the interconnection between solders, to prevent a copper conductor from being exposed and corroded, and to maintain the insulation between conductors for a long period. It is generally to use the thermosetting resins such as an epoxy resin or aminoplast resin as a main component of the printed solder.

Recently, however, as the demand for the high-density of printed circuit board and the insulation between conductors increase, the solder mask is required to have an excellent precision in film thickness and an excellent precision in size. A screen-printing is not satisfactory for such demands.

Therefore it is desired to develop a solder mask having excellent size precision and reliability produced through the formation of a thick film on a conductor (preferable a thickness of 25 micrometers) by a photolithography which is a process for producing a pattern through continuously exposing the pattern and developing it.

Conventionally, as a photosensitive resin for forming a solder mask, it is common to employ a photosensitive resin comprising acrylic polymers and photopolymerizable monomer as main components, such as disclosed in Japanese Patent Unexamined Publication Nos. Sho 53-56018 and Sho 54-1018.

However, in order to impart the photosensitive resin to a film-formation property, it is necessary to use a great amount of acrylic polymers so that the heat-resistance of a resultant cured film is insufficient.

Furthermore, Japanese Patent Unexamined Publication No. Sho 54-82073 discloses a composition comprising a photosensitive epoxy resin containing a cinnamophenone (chalcone) in the main chain and an epoxy resin-curing agent. The composition is an excellent heat-resistant composition. However, the sensitivity of the photosensitive composition is insufficient to form a thick film photo resist. Additionally, since the composition needs to use inflammable solvents such as cyclohexanone as a developing solution, the safety becomes an important issue in the manufacturing process. Moreover, Japanese Patent Unexamined Publication No. Sho 61-272 discloses a composition comprising an epoxy-containing phenolic novolac resin type epoxy acrylate and a photopolymerization initiator as main components. The composition could form a thick film solder mask after curing. Although the composition has an excellent heat-resistance, it needs to use a mixture of trifluoroethane and lower alcohols as a developing solvent, so it also has a safety issue.

Furthermore, Japanese Patent Unexamined Publication No. Hei 2-160242 discloses a photosensitive resin composition comprising an epoxy acrylate resin containing carboxyl group. Japanese Patent Unexamined Publication No. Hei 2-166452 discloses an alkali soluble photosensitive resin composition comprising a carboxyl group-containing styrenic polymer. If an imaging pigment such as colorless crystal violet, which color will change when exposing to ultraviolet light, is added to both resin compositions disclosed in the above two prior references, the color of the imaging pigment will change from colorless to purple blue due to its poor stability and the pigment will loss its ability to change color upon exposing to ultraviolet light. It causes the trouble to operators since they cannot judge whether the exposing process is completed. Hence, what the operators can do is to repeat the exposing process. Such instability will not only make the process of production complicated but also cause low throughput, high cost and increasing amount of waste. Therefore, it generally uses the resin composition without incorporating the imaging pigment (color changeable pigment).

DETAILED DESCRIPTION OF THE INVENTION

Figure 1:
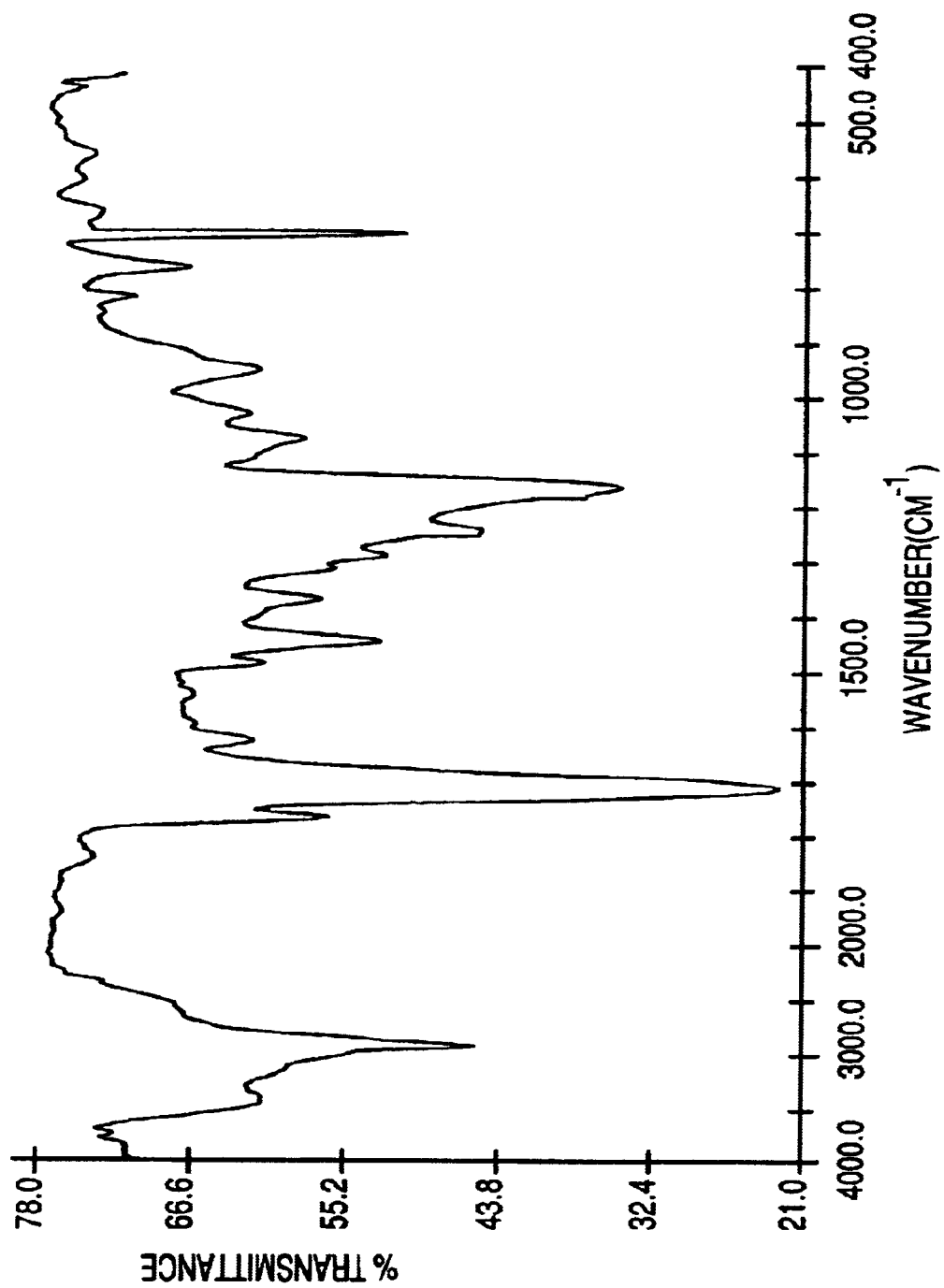
FIG. 1 shows an infrared-absorption spectrum of the product produced in Example 1.

One aspect of the present invention is to provide a novel styrene-anhydride copolymer containing amido group.

Another aspect of the present invention is to provide a process for preparing the novel styrene-anhydride copolymer containing amido group.

The other aspect of the present invention is to provide a photo resist comprising the styrene-anhydride copolymer containing amido group, which is useful as an alkali soluble developing photo resist in the irradiation reaction and as a solder resistant photo resist in the printed circuit board.

The term "(meth)acrylates" used herein means to represent acrylates and methacrylates.

The present styrene-anhydride copolymer containing amido group comprises the following repeating units (I) and (II):

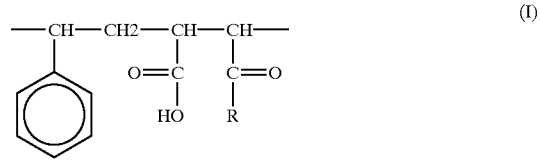

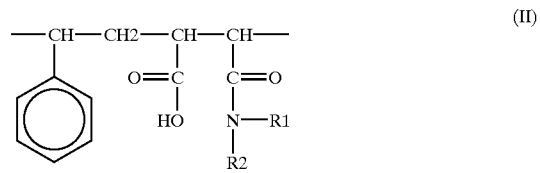

wherein
R represents a residue of (meth)acrylate monomer containing hydroxyl group;
$R^1$ and $R^2$ are the same or different and each represents a $C_{1-6}$ alkyl group, or $R^1$ and $R^2$ are taken together with the nitrogen atom to which they attach to form a 5 to 6-member heterocyclic group containing nitrogen.

In the present styrene-anhydride copolymer containing amido group, the residue of (meth)acrylate monomer containing hydroxyl group represented by R in unit (I) is a residue derived from $C_{1-6}$ alkyl (meth)acrylates. Examples of the $C_{1-6}$ alkyl (meth)acrylates include hydroxymethyl acrylate, hydroxyethyl acrylate, hydroxy-n-propyl acrylate, hydroxyisopropyl acrylate, hydroxy-n-butyl acrylate, hydroxyisobutyl acrylate, hydroxy-t-butyl acrylate, hydroxypentyl acrylate, hydroxyhexyl acrylate, hydroxymethyl (meth)acrylate, hydroxyethyl (meth)acrylate, hydroxy-n-propyl (meth)acrylate, hydroxyisopropyl (meth)acrylate, hydroxy-n-butyl (meth)acrylate, hydroxyisobutyl (meth)acrylate, hydroxy-t-butyl (meth)acrylate, hydroxypentyl (meth)acrylate, hydroxyhexyl (meth)acrylate. Among others, hydroxyethyl acrylate, hydroxyethyl (meth)acrylate, hydroxy-n-propyl acrylate, and hydroxy-n-propyl (meth) acrylate are preferable.

In the present styrene-anhydride copolymer containing amido group, the $C_{1-6}$ alkyl group represented by $R^1$ and $R^2$ means an alkyl group containing 1 to 6 carbon atoms. Examples of the $C_{1-6}$ alkyl group include methyl, ethyl, n-propyl, iso-propyl, n-butyl, iso-butyl, t-butyl, pentyl, and hexyl, etc. Among others, ethyl, n-propyl, and n-butyl are preferable.

In the present styrene-anhydride copolymer containing amido group, the 5- to 6-member heterocyclic group containing nitrogen formed from $R^1$ and $R^2$ taken together with the nitrogen atom to which they attached is a 5- to 6-member saturated heterocyclic group containing one to two hetero atom selected from nitrogen, oxygen, and sulfur atoms, in addition to the nitrogen atom to which $R^1$ and $R^2$ attach. Examples of the 5- to 6-member saturated heterocyclic group include pyrrolidinyl, pyrazolidinyl, imidazolidinyl, oxazolidinyl, oxadiazolidinyl, thiazolidinyl, piperidyl, piperazinyl, morpholinyl etc. Among others, morpholinyl is preferable.

In the present styrene-anhydride copolymer containing amido group of the invention, the ratio of unit (I) to unit (II) is from 25:75 to 90:10, preferably 30:70 to 70:30.

Due to the present styrene-anhydride copolymer containing amido group contains the amido group, which impart the copolymer water solubility, an aqueous organic solvent can be used as a diluents for formulating the copolymer into a photosensitive resin composition. Consequently, the amount of organic solvent commonly used for formulating photosensitive resin composition will decrease so that operational environment will be improved to be good for the operators' health.

The present invention provides a process for preparing the styrene-anhydride copolymer containing amido group of the invention comprises:

(a) reacting styrene-maleic anhydride copolymer having the following repeating unit (III):

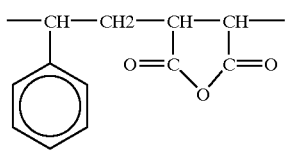

(III)

with secondary amine in a solvent to allow the anhydride portion of styrene-maleic anhydride copolymer to subject to partially ring-opening; in which the secondary amine is used in an amount of 0.25 to 0.75 moles per mole of the styrene-maleic anhydride copolymer;

(b) reacting the resultant product with hydroxy-$C_{1-6}$ alkyl (meth)acrylates to allow the ring-no opened anhydride portion to subject to partially ring-opening; wherein the amount of the hydroxy-$C_{1-6}$ alkyl (meth)acrylates are determined according to the following criterions, i.e. the total moles of the secondary amine used in the step (a) and of the hydroxy-$C_{1-6}$ alkyl (meth)acrylates is equal to or less than the moles of the styrene-maleic anhydride copolymer. If the hydroxy-$C_{1-6}$ alkyl (meth) acrylates in the step (b) is used in an amount for providing the total moles of the secondary amine used in the step (a) and of the hydroxy-$C_{1-6}$ alkyl (meth) acrylates less than the moles of the styrene-maleic anhydride copolymer, additional $C_{1-6}$ alkyl alcohol can be added in the step (b), if necessary, to allow the reminder anhydride to ring-open.

The reactions in the steps (a) and (b) are carried out in the presence of solvents at a temperature of from 60° C. to 150° C., preferably from 80° C. to 110° C.

Suitable examples of the secondary amine used in the present invention include dimethyl amine, diethyl amine, dipropyl amine, methylethyl amine, methylpropyl amine, dibutyl amine, ethylpropyl amine, dipentyl amine, dihexyl amine, ethylbutyl amine, pyrrolidine, pyrazolidine, imidazoline, oxazolidine, oxadiazoline, thiazoline, piperidine, piperazine, or morpholine etc. Among others, diethyl amine, dipropyl amine, dibutyl amine, dihexyl amine, and morpholine are preferable.

Suitable examples of the $C_{1-6}$ (meth)acrylates used in the present invention include hydroxymethyl acrylate, hydroxyethyl acrylate, hydroxy-n-propyl acrylate, hydroxyisopropyl acrylate, hydroxy-n-butyl acrylate, hydroxyisobutyl acrylate, hydroxy-t-butyl acrylate, hydroxypentyl acrylate, hydroxyhexyl acrylate, hydroxymethyl (meth)acrylate, hydroxyethyl (meth)acrylate, hydroxy-n-propyl (meth) acrylate, hydroxyisopropyl (meth)acrylate, hydroxy-n-butyl (meth)acrylate, hydroxyisobutyl (meth)acrylate, hydroxy-t-butyl (meth)acrylate, hydroxypentyl (meth)acrylate, hydroxyhexyl (meth)acrylate. Among others, hydroxyethyl acrylate, hydroxyethyl (meth)acrylate, hydroxy-n-propyl acrylate, and hydroxy-n-propyl (meth)acrylate are preferable.

The solvent used in the present invention is not critical as long as it is inert to the reaction. Examples of the solvent include ketones such as acetone, methylethyl ketone,; esters such as ethyl acetate and carbitol acetate; aromatic hydrocarbons such as benzene, toluene, petroleum naphtha e.g. Solvesso #150 and #100 commercially available from Chinese petroleum company, Taiwan, R.O.C.

In the process for preparing the present styrene-anhydride copolymer containing amido group, since partially anhydride functional groups are ring-opened with the secondary amine, the ring-opening reaction of the reminder anhydride functional groups with the hydroxy-$C_{1-6}$ alkyl (meth) acrylates can be conducted completely without use of catalysts. Therefore, the reactivity of the anhydride functional group of the styrene-anhydride copolymer is almost up to 100%.

The present styrene-anhydride copolymer containing amido group can be used as a component in an alkali developing photo resist composition, which has a high resolution and can therefore be used in manufacturing printed circuit board with high density circuit.

The present invention further relates to an alkali developing photo resist composition, which comprises the styrene-anhydride copolymer containing amido group of the invention as an active ingredient. The composition further comprises photo initiators, diluents, (meth)acrylates monomers having ethylenic unsaturated bonds, and fillers. The composition can comprise dyes if necessary.

The present invention further relates to a solder resistant photo resist composition, which comprises the styrene-anhydride copolymer containing amido group of the invention as an active ingredient. The composition further comprises photo initiators, diluents, (meth)acrylates monomers having ethylenic unsaturated bonds, crosslinking agents, curing promoters, and fillers.

The photo initiators used in the present invention are well known by those skilled in the art. The non-limiting examples of the photo initiators include Irgacure 907 (commercially available from Ciba Gigey AG.), isopropyl thiaanthracenone and diethyl thiaanthracenone etc.

The diluents used in the present invention are well known by those skilled in the art. The non-limiting examples of the diluents include Solvesso #100, Solvesso #150 (a petroleum naphtha commercially available from Chinese petroleum company, Taiwan, R.O.C.) etc.

The (meth)acrylates monomers having ethylenic unsaturated bonds used in the present invention are well known by those skilled in the art. The non-limiting examples of the (meth)acrylates monomers having ethylenic unsaturated bonds include dipentaerythritol triacrylate (commercially available from Sartomer Co. as a trade name Sartomer 399), trimethylol triacrylate (commercially available from Sartomer Co. as a trade name Sartomer 351), and triethoxyl triacrylate (commercially available from Sartomer Co. as a trade name Sartomer 454) etc.

The fillers used in the present invention are well known by those skilled in the art. The non-limiting examples of the fillers include barium sulfate, talc, and silicon dioxide etc.

The crosslinking agents used in the present invention are well known by those skilled in the art. The non-limiting examples of the crosslinking agents include epoxy resin such as PT 810(commercially available from Ciba Gergy Co.), NPCN 703, NPCN 704 (commercially available from Nan-Ya plastic Corporation., Taiwan, R.O.C.), and YX 4000 (commercially available from Yuka Shell Co. Japan), and melamine and its derivatives etc.

The curing promoters used in the present invention are well known by those skilled in the art. The non-limiting examples of the curing promoters include melamine and dicyanodiamide etc.

The dyes used in the present invention are well known by those skilled in the art. The non-limiting examples of the dyes include pigments and colorants. The examples include 2Y301 (commercially available from Toyo Co. Japan), white Crystal Violet, Victoria Pure Blue B (basic blue), Victoria Blue BO (green light basic blue), Victoria Blue R (red light basic blue), Peacock Green, Leuco Crystal Violet etc. The following examples are only intended to illustrate the present invention more detailed without limiting the scope the invention.

EXAMPLES

Example 1

200 grams of styrene-anhydride copolymer (SMA-1000, manufactured by and commercially available from Sartomer Co.) and 30.9 grams of di-butylamine were added to 207.9 grams of propylene glycol monoethyl ether acetate. The reaction mixture is stirred at 90° C. for 2 hours. Then 16.7 grams of hydroxyethyl methacrylate was added to the mixture and stirred at 90° C. for further 8 hours. To the resultant mixture was added 16.7 grams of n-butanol and stirred at 90° C. for further 4 hours to obtain the styrene-anhydride copolymer containing amido group of the invention. The styrene-anhydride copolymer containing amido group of the invention is analyzed by IR spectrometer and its IR spectrum is shown in FIG. 1. From the IR spectrum it is clearly shown that 100% of the anhydride functional groups were ring-opened. The solid content and acid number of the product were measured and found as 60% and 176 mg KOH/g, respectively.

Example 2

Figure 2:
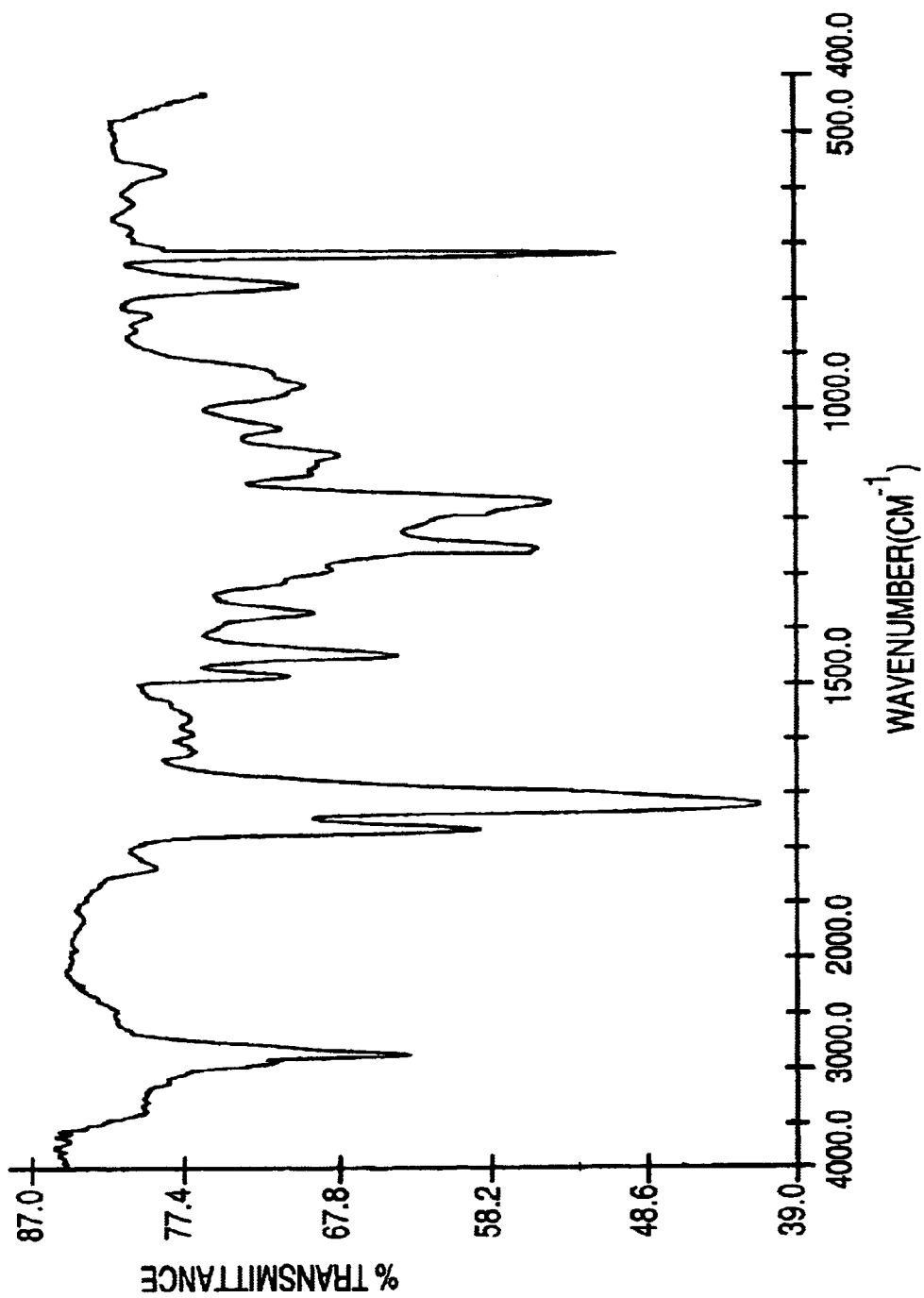
FIG. 2 shows an infrared-absorption spectrum of the product produced in Example 2.

200 grams of styrene-anhydride copolymer (SMA-3000, manufactured by and commercially available from Sartomer Co.) and 23.1 grams of di-butylamine were added to 177.6 grams of propylene glycol monoethyl ether acetate. The reaction mixture is stirred at 90° C. for 2 hours. Then 33.3 grams of hydroxyethyl methacrylate was added to the mixture and stirred at 90° C. for further 8 hours. To the resultant mixture was added 9.9 grams of n-butanol and stirred at 90° C. for further 4 hours to obtain the styrene-anhydride copolymer containing amido group of the invention. The styrene-anhydride copolymer containing amido group of the invention is analyzed by IR spectrometer and its IR spectrum is shown in FIG. 2. From the IR spectrum it is clearly shown that 100% of the anhydride functional groups were ring-opened. The solid content and acid number of the product were measured and found to be 60% and 117 mg KOH/g, respectively.

Comparative Example 1

This comparative example illustrated a preparation of a conventional photosensitive resin containing no amido group.

210 grams of epoxy resin (trade name NPCN 704, manufactured by and commercially available from Nan-Ya Plastic corporation, Taiwan, R.O.C.), 72 grams of acrylic acid, 0.3 grams hydroquinone, and 0.9 grams of tetrabutylammonium bromide were added to 215 grams of carbitol acetate. The resultant mixture was stirred at 90° C. for 18 hours. Then 118 grams of tetrahydrophthalic anhydride was stirred at 90° C. for 4 hours to obtain a resin product. The solid content and acid number of the product were measured and found to be 65% and 109 mg KOH/g, respectively.

Comparative Example 2

This comparative example illustrated a preparation of a conventional photosensitive resin containing no amido group. 200 grams of epoxy resin (trade name SMA-1000, manufactured by and commercially available from Sartomer Co.), 0.26 grams hydroquinone, 1.5 grams of tetrabutylammonium bromide, and 112.2 grams of hydroxyethyl methacrylate were added to 215 grams of propylene glycol monoethyl ether acetate. The resultant mixture was stirred at 90° C. for 16 hours to obtain a resin product. The solid content and acid number of the product were measured and found to be 60% and 154 mg KOH/g, respectively.

Formulation Examples

Firstly, the method for determining property performance of formulations and the meanings of terms are illustrated as follows.

Hardness of film after pose-baking treatment: it is measured by using a pencil hardness tester. The number increases in line with the hardness increase.

Tackiness of film after backing treatment: it is carried out by a fingerprint method. The less fingerprint remaining on the film means a better performance.

Photosensitivity: a photo curing ability is determined by using Stouffer step film. The more the numbers are, the better for the photosensitivity.

Resolution after developing: the resolution after developing is determined by using Stouffer step film. The more the numbers are, the better for the resolution.

Adhesion after developing: the adhesion after developing is determined by using Stouffer step film. The more the numbers are, the better for the adhesion.

De-filming ability: the de-filming ability is determined as the time that a dry film is peeled from a metal substrate after immersing in a 3% NaOH aqueous solution at 50° C. The time is counted by second. The shorter of the time is better.

One-hundred lattices adhesion: the following steps determine the one-hundred lattices adhesion. A resin composition is applied on a plaque and air-dried to form a dry film. The film is cut into 10×10 squares with 1 cm² each. A tape is stuck to the film and peeled off quickly. The amount of the film squares remained on the plaque is determined. The more the numbers, the better for adhesion.

Acid-resistance: the acid-resistance is determined as the time that a dry film is damaged after immersing in a 10% $H_2SO_4$ aqueous solution. The time is counted by minute. The longer of the time is, the better for acid-resistance.

Alkali-resistance: the alkali-resistance is determined as the time that a dry film is damaged after immersing in a 10% NaOH aqueous solution. The time is in terms of minute. The longer of the time means the better alkali-resistance.

Solder-resistance: the solder-resistance is determined by immersing a dry film into a solder bath at 230° C. for 30 seconds and taken from the bath, repeating the above steps, and accounting the cycle numbers before the film damages. The more of the number means the better of the solder-resistance.

Solder assistant-resistance: the solder assistant-resistance is determined by applying a solder assistant on a dry film at room temperature, baking the resultant film at 90° C., and determining the time in terms of minute until the film damages. The longer of the time means the better of the solder assistant-resistance.

Isopropyl alcohol-resistance: the isopropyl alcohol-resistance is determined by immersing a dry film into 100% isopropyl alcohol and determining the time in terms of minute until the film damages. The longer of the time means the better of the isopropyl alcohol-resistance. Note: the dry film is formed from a resin composition containing a photosensitive resin.

Formulation Examples 1–2 and Comparative Formulation Examples 1–2

Developing photo resists were formulated by using the styrene-anhydride copolymers containing amido group of the invention prepared from Examples 1 and 2 and the conventional photosensitive resin containing no amido group prepared from Comparative examples 1 and 2. Ingredients constituting the photo resist and their amount are listed in Table 1 below. The prepared developing photo resists were determined for their performance mentioned above. The results are shown in Table 1-1.

TABLE 1

Developing photo resists formulation

| | Formulation Example 1 | Formulation Example 2 | Comparative Formulation Example 1 | Comparative Formulation Example 2 |
|---|---|---|---|---|
| Resin (wt %) | Copolymer of Example 1 (58.0) | Copolymer of Example 1 (49.0) + Copolymer of Example 2 (9.0) | Copolymer of Comparative Example 1 (54.5) | Copolymer of Comparative Example 2 (58.0) |
| Trihydroxypropyl ethoxy-triacrylate[1] (wt %) | 11.7 | 11.7 | 7.0 | 11.7 |
| Irgacure-907[2] (wt %) | 2.0 | — | 2.0 | 2.0 |
| isopropyl thia-anthracenone (wt %) | 0.3 | — | 0.3 | 0.3 |
| Benzophenone (wt %) | — | 0.8 | 0.8 | 0.8 |
| Hexaaryl diimidazole (wt %) | — | 2.0 | 2.0 | 2.0 |
| $H_2O$ (wt %) | 1.6 | 1.4 | — | — |
| Carbitol acetate (wt %) | — | — | 4.0 | — |
| Solvesso #150[3] (wt %) | 1.6 | 1.4 | 4.6 | 0.4 |
| $BaSO_4$ (wt %) | 7.5 | 7.5 | 7.5 | 7.5 |
| Talc (wt %) | 17.2 | 17.1 | 17.1 | 17.1 |
| Peacock green (wt %) | 0.1 | 0.1 | 0.1 | 0.1 |
| Leuco Crystal Violet (wt %) | — | 0.1 | 0.1 | 0.1 |
| Total (wt %) | 100 | 100 | 100 | 100 |

Note:
[1] a trifunctional acrylate monomer commercially available from Sartomer Co.
[2] a photoinitiator commercially available from Ciba Gigey AG.
[3] a petroleum naphtha commercially available from Chinese petroleum The resultant photo resists prepared from Table 1 were each applied on a copper metal substrate and baked at 140° C. for 3 minutes to obtain a dry film having a thickness of 8 micrometers. Each dry film was subjected to post-baking treatment at 150° C. for 65 minutes. In the photosensitivity test, the exposing energy is 100 mj. The results are shown in Table 1-1.

TABLE 1-1

| | Formulation Example 1 | Formulation Example 2 | Comparative Formulation Example 1 | Comparative Formulation Example 2 |
|---|---|---|---|---|
| Tackiness of film after backing treatment | None | none | none | None |
| Color stability of a solution | 30 days up | 30 days up | 24 hours | 3 days |
| Photo-sensitivity | 9 | 9 | 5 | 7 |
| Resolution after developing (μm) | 25 | 25 | 50 | 25 |
| Adhesion after developing (μm) | 25 | 25 | 50 | 25 |

TABLE 1-1-continued

|  | Formulation Example 1 | Formulation Example 2 | Comparative Formulation Example 1 | Comparative Formulation Example 2 |
|---|---|---|---|---|
| Hardness of film after pose-baking treatment | HB | HB | HB | HB |
| De-filming ability (sec) | 25 | 25 | 30 | 25 |
| One-hundred lattices adhesion | 100% | 100% | 100% | 100% |

Solder resistant photo resists were formulated by using the styrene-anhydride copolymers containing amido group of the invention prepared from Examples 1 and 2 and the conventional photosensitive resin containing no amido group prepared from Comparative example 1. Ingredients constituting the photo resist and their amount are listed in Table 2 below. The prepared photo resists were determined for their performance mentioned above. The results are shown in Table 2-1.

TABLE 2

Solder resistant photo resists formulation (solid epoxy resin)

|  | Formulation Example 3 | Comparative Formulation Example 3 |
|---|---|---|
| Resin (wt %) | Copolymer of Example 1 (48.0) + Copolymer of Example 2 (8.0) | Copolymer of Comparative Example 1 (53.5) |
| SR454[1] (wt %) | 0.5 | 0.5 |
| SR399[2] (wt %) | 6.0 | 6.0 |
| Irgacure-907[3] (wt %) | 4.00 | 4.00 |
| Isopropyl thiaanthracenone (wt %) | 0.4 | 0.4 |
| Carbitol acetate (wt %) | 0.00 | 0.00 |
| Solvesso #150[4] (wt %) | 0.00 | 2.4 |
| BaSO$_4$ (wt %) | 18.00 | 18.00 |
| Talc (wt %) | 2.0 | 2.0 |
| YX4000[5] (wt %) | 3.5 | 3.5 |
| Triglycerol isocyanurate (wt %) | 6.4 | 6.5 |
| Dicyanodiamide (wt %) | 0.3 | 0.3 |
| Melamine (wt %) | 2.0 | 2.0 |
| 2Y301[6] (wt %) | 0.3 | 0.3 |
| Aerosil-300[7] (wt %) | 0.6 | 0.6 |
| Total (wt %) | 100.0 | 100.0 |

Note:
[1] a peatafunctional acrylate monomer commercially available from Sartomer Co.
[2] a trifunctional acrylate monomer commercially available from Sartomer Co.
[3] a photoinitiator commercial available from Ciba Gigey AG.
[4] a petroleum naphtha commercially available from Chinese petroleum company, Taiwan, R.O.C.
[5] an epoxy resin commercially available from Yuka Shell Co., Japan.
[6] a pigment commercially available from Toyo Ink Co., Japan.
[7] a thickner commercially available from Degussa Co., Japan.

The resultant photo resists prepared from Table 2 were each applied on a copper metal substrate and baked at 74° C. for 45 minutes to obtain a dry film having a thickness of 18 micrometers. Each dry film was subjected to post-baking treatment at 150° C. for 65 minutes. In the photosensitivity test, the exposing energy is 475 mj. The results are shown in Table 2-1.

TABLE 2-1

|  | Formulation Example 3 | Comparative Formulation Example 3 |
|---|---|---|
| Tackiness of film after backing treatment | None | none |
| Photosensitivity | 8 | 6 |
| Resolution after developing (μm) | 25 | 25 |
| Adhesion after developing (μm) | 25 | 25 |
| Hardness of film after pose-baking treatment | 7 H | 7 H |
| Acid-resistance (min) | 10 up | 10 up |
| Alkali-resistance (min) | 60 up | 60 up |
| Solder-resistance (times) | 5 up | 5 up |
| One-hundred lattices adhesion | 100% | 100% |
| Solder assistant-Resistance (min) | 30 | 30 |
| Isopropyl alcohol-Resistance (min) | 120 | 120 |

Note:
The solder assistant is LONCO RF800 commercially available from ALPHA metal Co.

From the results, it is shown that the present styrene-anhydride copolymer containing amido group not only has excellent heat-resistance, acid-resistance, and alkali-resistance but also has excellent resolution, which is therefore useful as a developing photo resist and a solder resistant photo resist for printed circuit board.

What is claimed is:

1. A styrene-anhydride copolymer containing amido group comprising the following repeating units (I) and (II):

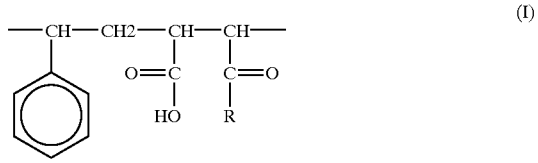

(I)

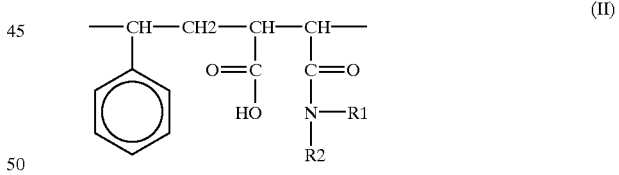

(II)

wherein
  R represents a residue of (meth)acrylate monomer containing hydroxyl group;
  $R^1$ and $R^2$ are the same or different and each represent a $C_{1-6}$ alkyl group, or $R^1$ and $R^2$ are taken together with the nitrogen atom to which they attach to form a 5- to 6-member heterocyclic group containing nitrogen.

2. The styrene-anhydride copolymer containing amido group according to claim 1, wherein R is a residue derived from $C_{1-6}$ alkyl (meth)acrylates.

3. The styrene-anhydride copolymer containing amido group according to claim 2, wherein the $C_{1-6}$ alkyl (meth)acrylates are selected from the group consisting of hydroxymethyl acrylate, hydroxyethyl acrylate, hydroxy-n-propyl acrylate, hydroxyisopropyl acrylate, hydroxy-n-butyl acrylate, hydroxyisobutyl acrylate, hydroxy-t-butyl acrylate, hydroxypentyl acrylate, hydroxyhexyl acrylate, hydroxymethyl (meth)acrylate, hydroxyethyl (meth)acrylate, hydroxy-n-propyl (meth)acrylate, hydroxyisopropyl (meth)acrylate, hydroxy-n-butyl (meth)acrylate, hydroxyisobutyl (meth)acrylate, hydroxy-t-butyl (meth)acrylate, hydroxypentyl (meth)acrylate, and hydroxyhexyl (meth)acrylate.

4. The styrene-anhydride copolymer containing amido group according to claim 2, wherein R is a residue derived from hydroxyethyl acrylate, hydroxyethyl (meth)acrylate, hydroxy-n-propyl acrylate, or hydroxy-n-propyl (meth)acrylate.

5. The styrene-anhydride copolymer containing amido group according to claim 1, wherein $R^1$ and $R^2$ are the same or different and each represents methyl, ethyl, n-propyl, iso-propyl, n-butyl, iso-butyl, t-butyl, pentyl, or hexyl.

6. The styrene-anhydride copolymer containing amido group according to claim 5, wherein $R^1$ and $R^2$ are the same or different and each represents ethyl, n-propyl, n-butyl, or hexyl.

7. The styrene-anhydride copolymer containing amido group according to claim 1, wherein $R^1$ and $R^2$ are taken together with the nitrogen atom to which they attach to form a 5- to 6-member heterocyclic group containing nitrogen.

8. The styrene-anhydride copolymer containing amido group according to claim 7, wherein $R^1$ and $R^2$ are taken together with the nitrogen atom to which they attach to form pyrrolidinyl, pyrazolidinyl, imidazolidinyl, oxazolidinyl, oxadiazolidinyl, thiazolidinyl, piperidyl, piperazinyl, or morpholinyl.

9. The styrene-anhydride copolymer containing amido group according to claim 1, wherein the ratio of unit (I) to unit (II) is from 25:75 to 90:10.

10. An alkali developing photo resist comprising the styrene-anhydride copolymer containing amido group according to claim 1.

11. A solder resistant photo resist comprising the styrene-anhydride copolymer containing amido group according to claim 1.

12. A process for preparing the styrene-anhydride copolymer containing amido group, which comprises the steps of:

(a) reacting styrene-maleic anhydride copolymer having the following repeating unit (III):

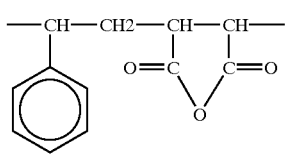

(III)

with secondary amine in a solvent to allow the anhydride portion of styrene-maleic anhydride copolymer subjecting to partially ring-opening; in which the secondary amine is used in an amount of 0.25 to 0.75 moles per mole of the styrene-maleic anhydride copolymer;

(b) reacting the resultant product with hydroxy-$C_{1-6}$ alkyl (meth)acrylates to allow the ring-no opened anhydride portion subjecting to partially ring-opening; wherein the hydroxy-$C_{1-6}$ alkyl (meth)acrylates are used in an amount such that the total moles of the secondary amine used in the step (a) and of the hydroxy-$C_{1-6}$ alkyl (meth)acrylates is equal to or less than the moles of the styrene-maleic anhydride copolymer.

13. The process according to claim 12, wherein the secondary amines are selected from the group consisting of dimethyl amine, diethyl amine, dipropyl amine, methylethyl amine, methylpropyl amine, dibutyl amine, ethylpropyl amine, dipentyl amine, dihexyl amine, ethylbutyl amine, pyrrolidine, pyrazolidine, imidazoline, oxazolidine, oxadiazoline, thiazoline, piperidine, piperazine, and morpholine.

14. The process according to claim 13, wherein the secondary amines are selected from the group consisting of diethyl amine, dipropyl amine, dibutyl amine, dihexyl amine, and morpholine.

15. The process according to claim 12, wherein the $C_{1-6}$ alkyl (meth)acrylates are selected from the group consisting of hydroxymethyl acrylate, hydroxyethyl acrylate, hydroxy-n-propyl acrylate, hydroxyisopropyl acrylate, hydroxy-n-butyl acrylate, hydroxyisobutyl acrylate, hydroxy-t-butyl acrylate, hydroxypentyl acrylate, hydroxyhexyl acrylate, hydroxymethyl (meth)acrylate, hydroxyethyl (meth)acrylate, hydroxy-n-propyl (meth)acrylate, hydroxyisopropyl (meth)acrylate, hydroxy-n-butyl (meth)acrylate, hydroxyisobutyl (meth)acrylate, hydroxy-t-butyl (meth)acrylate, hydroxypentyl (meth)acrylate, and hydroxyhexyl (meth)acrylate.

16. The process according to claim 12, wherein the $C_{1-6}$ alkyl (meth)acrylates are selected from the group consisting of hydroxyethyl acrylate, hydroxyethyl (meth)acrylate, hydroxy-n-propyl acrylate, and hydroxy-n-propyl (meth)acrylate.

* * * * *